United States Patent [19]

Tobias et al.

[11] Patent Number: 5,030,538
[45] Date of Patent: Jul. 9, 1991

[54] METHOD FOR PRODUCING OVERHEAD TRANSPARENCIES HAVING HIGH COLOR DENSITY IMAGES USING A DOUBLE SIDED IMAGE RECORDING MATERIAL

[75] Inventors: Russell H. Tobias, Centerville; James A. Dowler, Dayton; Richard Sutera, Centerville, all of Ohio

[73] Assignee: The Mead Corporation, Dayton, Ohio

[21] Appl. No.: 517,271

[22] Filed: May 1, 1990

[51] Int. Cl.$^5$ .................. G03C 1/68; B41M 5/16; B41M 5/22
[52] U.S. Cl. .................. 430/138; 430/199; 430/202; 428/402.22; 428/402.24; 428/913; 428/914; 503/214; 503/225; 503/226
[58] Field of Search .................. 430/138, 199, 202; 428/402.22, 402.24, 913, 914; 503/214, 225, 226

[56] References Cited

U.S. PATENT DOCUMENTS

| | | | |
|---|---|---|---|
| 4,859,561 | 8/1989 | Metz et al. | 430/138 |
| 4,873,167 | 10/1989 | Asano | 430/138 |
| 4,910,117 | 3/1990 | Dowler et al. | 430/138 |
| 4,910,118 | 3/1990 | Dowler et al. | 430/138 |
| 4,921,832 | 5/1990 | Adair et al. | 430/138 |

*Primary Examiner*—Paul R. Michl
*Assistant Examiner*—Patrick A. Doody
*Attorney, Agent, or Firm*—Thompson, Hine and Flory

[57] ABSTRACT

A method is described for forming a transparency containing images having high color density comprising the steps of:
forming an imaging sheet, said imaging sheet comprising a substrate having a layer of microcapsules on the front surface and on the back surface thereof, of microcapsules containing an internal phase which undergoes a physical change upon exposure to actinic radiation, and a color forming agent which is capable of reacting with a developer-containing resing to form a visible image thereon;
simultaneously image-wise exposing said microcapsules on said front and said back surfaces of said imaging sheet to actinic radiation;
assembling said exposed imaging sheet between a pair of developer sheets wherein each of said developer sheets comprises a substrate having a layer of developer-containing resin on one surface thereof, said layer of developer-containing resin on each of said developer sheets contacting the adjacent surface of said imaging sheet;
subjecting said assembly to a uniform rupturing and transfer force wherein said microcapsules are ruptured in an image-wise pattern and said color-forming agent contained in said ruptured capsules is transferred to said developer-containing resin wherein an image-wise reaction between said developer-containing resin and said color-forming agent produces a visible image on each developer sheet, said visible images being mirror images of each other;
separating said developer sheets from said imaging sheet;
assembling said developer sheets such that said visible images are in registration, said visible images being mirror images of each other; and
adhering said developer sheets, one to the other, to provide a transparency having high color density.

19 Claims, 2 Drawing Sheets

METHOD FOR PRODUCING OVERHEAD TRANSPARENCIES HAVING HIGH COLOR DENSITY IMAGES USING A DOUBLE SIDED IMAGE RECORDING MATERIAL

BACKGROUND OF THE INVENTION

1. Field of the Invention

The present invention relates to transparencies for overhead projection. More particularly, the present invention relates to a method for producing transparencies for overhead projection having high color density images wherein the image is formed by image-wise exposing a transparent support having a front surface and back surface coated with an imaging material comprising rupturable microcapsules containing, as an internal phase, a photosensitive composition, a photoinitiator and a color forming agent. Upon rupture of the capsules, the color forming agent on the front surface is image-wise developed and transferred to a developer on a first developer sheet to form an image thereon, and, simultaneously, the color forming agent on the back surface is developed and image-wise transferred to a developer on a second developer sheet to form a mirror image thereon. The two developer sheets containing the image and the mirror image are assembled in developer-to-developer contact and adhered to each other with the image and mirror image in registration to form a transparency having a high color density image.

2. Description of the Prior Art

Photosensitive imaging systems employing microencapsulated radiation-sensitive compositions (also known as cylithographic imaging systems) are the subject of commonly assigned U.S. Pat. Nos. 4,399,209, 4,772,541 and 4,842,976 to The Mead Corporation. These imaging systems are characterized in that an imaging sheet including a layer of microcapsules containing a photosensitive composition in the internal phase is image-wise exposed to actinic radiation. In the most typical embodiments, the photosensitive composition is a photopolymerizable composition including a polyethylenically unsaturated compound and a photoinitiator and is encapsulated with a color precursor. Exposure image-wise hardens the internal phase of the microcapsules. Following exposure, the imaging sheet is subjected to a uniform rupturing force by passing the sheet in contact with a developer sheet through the nip between a pair of pressure rollers whereupon the color precursor is transferred to the developer sheet where it reacts to form an image.

Research Disclosure No. 28246 published in October, 1987 discloses a process for improving color density in transparencies wherein two separate imaging sheets having photosensitive microcapsules containing an internal phase of a photosensitive composition and a color former are image-wise exposed to actinic radiation while the microcapsule layers of the imaging sheets are adjacent to each other so that the imaging sheets are in a mirror relationship. A developer sheet having a developer layer on each surface is placed between the two imaging sheets and the three sheets are then subjected to pressure to rupture the capsules which are in contact with the developer sheet. The color former is transferred from the ruptured capsule to the developer material forming a visible image on both sides of the developer sheet, the images being mirror images of each other.

SUMMARY OF THE INVENTION

This invention relates to improved transparencies having high color density images and which are safe for handling. The transparencies of the present invention comprise a single imaging sheet which includes a transparent support having a layer of photosensitive microcapsules on both the front and back surfaces thereof, said microcapsules containing a photohardenable or photosoftenable composition and a color precursor. Upon image-wise exposure each of the front and back sides of the imaging sheet is assembled with a developer sheet comprising a transparent substrate carrying a layer of a developer. The microcapsules are subjected to a uniform rupturing force wherein the microcapsules on each side of the imaging sheet are ruptured. The color precursor is released image-wise from the microcapsules on each side of the imaging sheet and transferred to the adjacent developer layer where it reacts to produce an image thereon. The two separate transparent sheets carrying the image-bearing developer layers are separated from the imaging sheet and are subsequently assembled and adhered to each other using, for example, a glossing apparatus heated to a temperature of from about 75° to about 135° C. in such a manner so that the image and mirror image on the respective developer sheets are in registration. A glossing apparatus useful in this invention is described in commonly assigned U.S. Pat. No. 4,806,733.

The developer layer of the present invention consists essentially of a thermoplastic phenolic resin and more particularly, a metallated phenolic resin. To enhance the reaction between the phenolic resin and the color precursor, the phenolic resin is preferably provided as a layer of finely divided particles. It is believed that the spaces presented among such particles provide a network of capillaries which draws the color precursor into the developer layer and thus provides greater contact between the color precursor and the developer thereby enhancing the reaction between the resin and the color precursor. The finely divided phenolic resin is achieved by coating a dispersion of the resin on the developer substrate and drying.

This imaging process is believed to be advantageous for several reasons. First of all, the transparencies produced project an image having an enhanced color density due to the adherence of the two transparent developer sheets carrying the two images which are in a mirror relationship with each other and are in registration. Moreover, in this method, any unreacted monomer released from the microcapsules is sandwiched between the developer sheets and trapped where it cannot come into contact with the skin upon handling. This is believed to be advantageous because some unreacted monomers may be irritants.

In accordance with a preferred embodiment of the invention, full color images are formed. In this embodiment, layers 14 and 14a contain a mixture of microcapsules having distinct wavelength sensitivities and containing cyan, magenta, yellow, and optionally black color formers. See U.S. Pat. No. 4,842,976. If the microcapsules are respectively sensitive to red, green, and blue light, the imaging sheet can be exposed by direct transmission or reflection imaging. In most cases, however, the microcapsules have distinct sensitivities in the ultraviolet spectrum. In this case, color separation or image processing is required to expose the imaging sheet. Using color separations, the imaging sheet is exposed to three distinct bands of ultraviolet radiation through the color separation in order to control the release and transfer of the cyan, magenta, and yellow color formers. Alternatively, a color image is resolved into its red, green, blue, and optionally black components, respectively, each of which is then electronically translated into radiation to which the photosensitive composition associated with the complimentary color former is sensitive. The exposure device will control three or four distinct bands of radiation which may be emitted from a single radiation source or a plurality of sources. For example, a Dunn or matrix camera may be used to produce electronic signals corresponding to the cyan, magenta, and yellow (and optionally black) images that are desired. This output drives the electronic control means for an exposure device which may include a conventional multiplexer logic package and timing means. The exposure device selectively drives a radiation source to which the microcapsules on the imaging sheet are sensitive and thereby image-wise exposes the imaging sheet.

DETAILED DESCRIPTION OF THE INVENTION

The present invention enables a cylithographic imaging system; i.e., a system utilizing photosensitive microcapsules, to be used in the production of transparencies wherein the images have a high color density. An additional benefit resulting from the present invention is that any unreacted chemicals or reaction products are sandwiched between the two developer layers preventing them from coming in contact with the skin upon handling.

The invention is useful in forming images on transparent films such as polyethylene terephthalate (PET) and more particularly xerographic transparent films. In selecting a transparent film for both the imaging sheet and the developer sheets it is desirable to use the thinnest and smoothest material which can be readily handled within the printer or copier as this reduces the amount of pressure required to rupture the microcapsules and cause the internal phase to exude and transfer to the developer layer. The thicker a substrate is, the larger is the area of the pressure nip through which it passes and the greater is the pressure which must be applied to achieve a predetermined lineal pressure. Similarly, the more irregular the surface, the greater is the pressure required to achieve a desired uniform lineal pressure. The preferred transparent films, balancing cost and effectiveness, are synthetic films ranging from about 0.5 to 12 mils (0.0005-0.012 inches) and more preferably about 3 to 6 mils (0.003-0.006 inches) in thickness. Thinner films are more difficult to handle and thus less desirable although from the standpoint of simplifying pressure roller design they may be desirable.

Imaging systems utilizing photosensitive microcapsules are described in U.S. Pat. Nos. 4,399,209, 4,440,846, 4,772,530 and 4,772,541 and 4,842,976 (full color). To the extent necessary, the teachings of these patents with respect to the preparation of microcapsules, image-forming agents, developer materials, exposure techniques, microencapsulation techniques, color precursors, photosensitive compositions, initiator systems, etc., are hereby incorporated by reference.

The microcapsules are filled with an internal phase comprising a photohardenable (the preferred embodiment) or photosoftenable composition including a photoinitiator, and a color precursor. The color precursor is typically a substantially colorless electron donating compound for which there are examples in the art. In the preferred embodiments of the invention the imaging sheets described in U.S. Pat. No. 4,772,541 are used.

Figure 1:
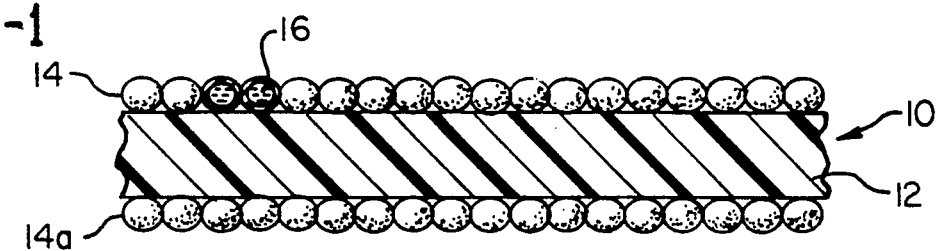
FIG. 1 is a schematic illustration in cross-section of a transparent imaging sheet containing photosensitive microcapsules on both sides used in accordance with the present invention.

FIG. 1 illustrates one example of an imaging sheet useful in the present invention. Therein an imaging sheet 10 is shown comprising a substrate 12 coated on both front and back surfaces with a layer of microcapsules 14 and 14a. Preferably the microcapsules contains three sets of microcapsules sensitive to red, green and blue light, and respectively containing cyan, magenta and yellow image-forming agents as described in U.S. Pat. No. 4,772,541.

Figure 2:
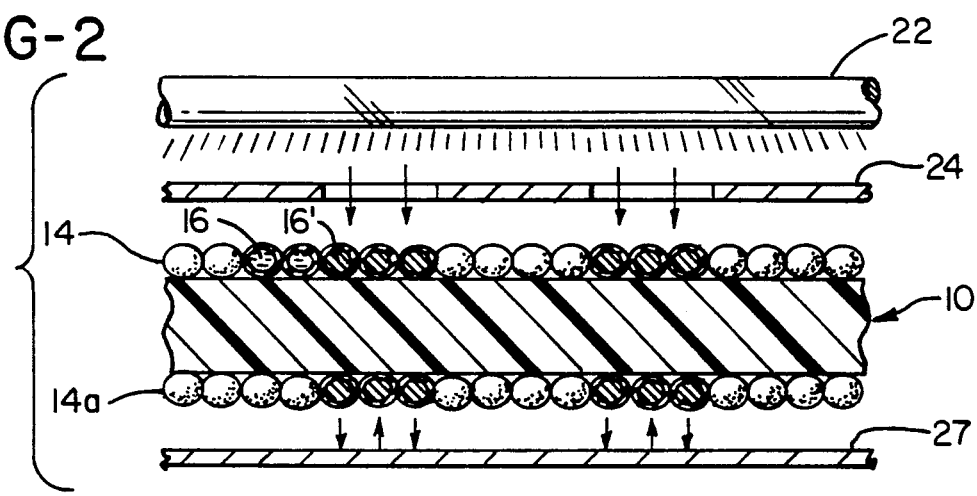
FIG. 2 is a schematic illustration in cross-section showing exposure of the transparent imaging sheet of FIG. 1.

Exposure of the imaging sheet 10 by transmission imaging is shown in FIG. 2 wherein a source of radiant energy 22 is positioned adjacent the surface of the imaging sheet 10 with a Mask 24 therebetween. In this illustration the photosensitive material is a positive working radiation curable material. Irradiation of the exposed areas 28 causes the radiation curable material in the internal phase 16 to polymerize, thereby gelling, solidifying or otherwise immobilizing the color precursor. To simplify the illustration, internal phase 16' in the exposed areas 28 is shown as a solid whereas the internal phase 16 remains liquid in the unexposed areas 26. In fact, the internal phase 16' may be semisolid and there may be degrees of solidification ranging from liquid to solid depending upon the amount of exposure any given microcapsule receives.

A reflective material 27 such as aluminum may be advantageously used to reflect light incident to microcapsule layers 14 and 14a back through microcapsule layers 14a and 14 to make more efficient use of the incident light and in this way improve the film speed of the imaging sheet.

Alternatively, light can be reflected from an original and simultaneously focused on the opposite surfaces of the imaging sheet using known optical means. In this manifestation of the present invention, the support material for the imaging layers 14 and 14a may be a transparent plastic film or a non-transparent material such as paper.

Figure 3:
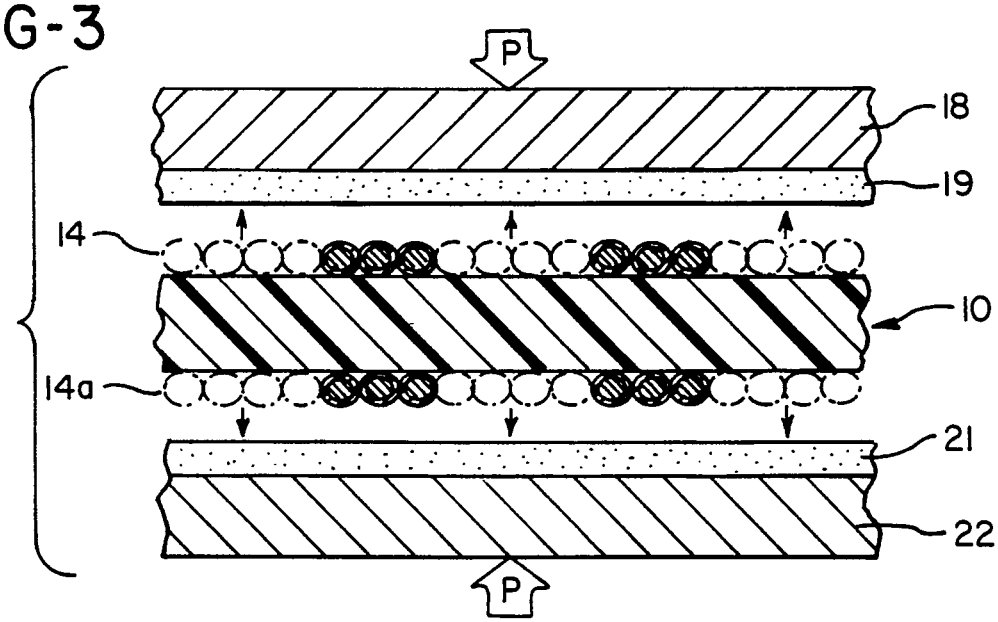
FIG. 3 is a schematic in cross-section showing the rupture of non-exposed microcapsules.
Figure 4:
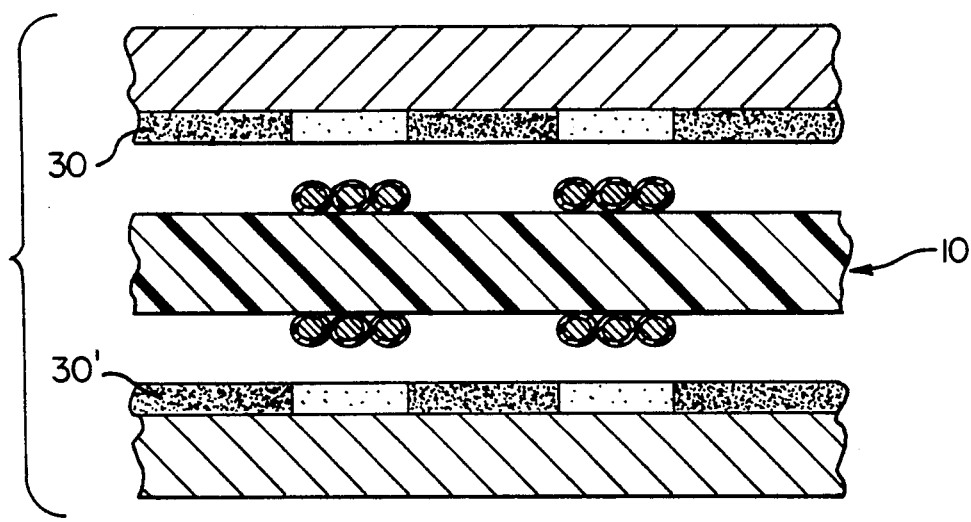
FIG. 4 is a schematic illustration in cross-section showing transfer of the color precursor from each side of the imaging sheet to form images in mirror relationship to each other on the two developer sheets.

Rupture of the unexposed microcapsules is shown in FIG. 3 wherein the now exposed imaging sheet 10 is placed with its two layers of exposed microcapsules 14 and 14a in face-to-face contact with developer layers 19 and 21 of developer donor sheets 18 and 20, and a pressure P is uniformly applied across the sheets. For simplification, the pressure is shown as rupturing the microcapsules in the unexposed areas 26 and not rupturing the microcapsules in the exposed areas 28. In actuality all the capsules may be ruptured, but the chromogenic material is immobilized by the increased viscosity of the photosensitive material in the internal phase 16' in the exposed areas 28. Typically the capsules are ruptured by passing the imaging sheet 10 and the two developer sheets 18 and 20 together through a nip between a pair or stack of pressure rollers. This causes the internal phase 16 from the unexposed areas 26 to transfer to the developer sheets 18 and 20 as is shown schematically by arrows in FIG. 3. Upon transfer of the internal phase 16 to the developer sheets 18 and 20, as shown in FIG. 4, the chromogenic material forms visible images 30 and 30' in the developer layers 19 and 21.

The visible image is usually the product of an acid-base reaction between the color precursor, which is usually an electron donor, and the developer which is usually an electron acceptor. Alternatively, coupling reactions analogous to those used in color photographic materials or redox reaction pairs may be used. Some of these alternative systems are described in U.S. Pat.No. 4,399,209.

Figure 5:
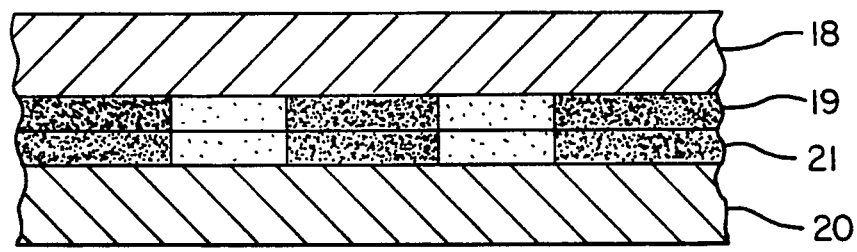
FIG. 5 is a schematic illustration in cross-section showing the two transparent developer sheets containing the two images in registration and mirror image relationship to each other.

FIG. 5 illustrates the registration of developer sheets 18 and 20. Heating the developer sheets 18 and 20 causes developer resins 19 and 21 present on developer sheets 18 and 20, respectively, to become tacky and adhere to each other. The degree of heating necessary to effect adhesion of the developer layers will depend on the nature of the developer resin and the degree of pressure to which the developer layers are subjected. Typically, the developer layers will be adhered to each other using pressure rollers which are heated to a temperature of from about 75° to 135° C.

Figure 6:
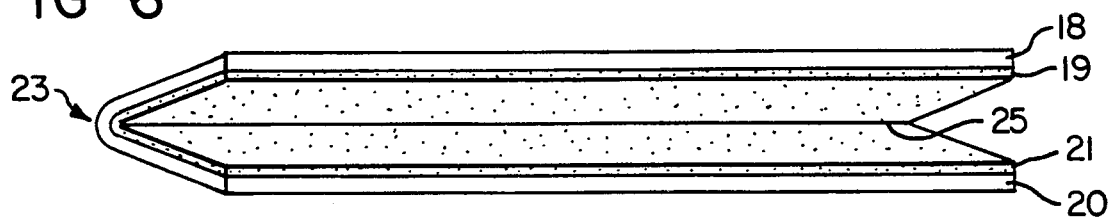
FIG. 6 is a perspective view of a double size developer sheet folded at the midline to form the two developer sheets useful in practicing the present invention.

FIG. 6 is a perspective drawing illustrating one example of developer sheets useful in performing registration of images on transparencies produced in accordance with the present invention. The transparent developer sheets 18 and 20 are derived from a substrate 23 which is twice as wide as the image-forming sheet (not shown) and is folded along a center line 25 to form a pair of developer sheets 18 and 20 having developer layers 19 and 21, respectively, thereon which then corresponds to the size of the image-forming sheet. As an alternative, individual developer sheets 18 and 20 may be bound together at one edge by adhesive or hot press means.

The internal phase of the microcapsules as described above can be encapsulated in any conventional manner. Oil soluble chromogenic materials have been encapsulated in hydrophilic wall-forming materials such as gelatin wall-forming materials (see U.S. Pat. Nos. 2,730,456 and 2,800,457 to Green et al) including gum arabic, polyvinyl alcohol, carboxymethylcellulose; resorcinolformaldehyde wall-formers (see U.S. Pat. No. 3,755,190 to Hart et al), isocyanate wall-formers (see U.S. Pat. No. 3,914,511 to Vassiliades) isocyanate-polyol wall-formers (see U.S. Pat. No. 3,796,669 to Kiritani et al) ureaformaldehyde wall-formers and more particularly Urearesorcinolformaldehyde wall forms (in which oleophilicity is enhanced by the addition of resorcinal) (see U.S. Pat. Nos. 4,001,140; 4,087,376 and 4,089,802 to Foris et al) melamineformaldehyde resin and hydroxypropyl cellulose (see commonly assigned U.S. Pat. No. 4,0925,455 to Shackle). Preferred methods are described in U.S. Pat. Nos. 4,772,530 and 4,722,541.

A particularly preferred method for preparing microcapsules is described in U.S. application Ser. No. 073036 filed July 14, 1987.

The imaging sheet used in the present invention can be prepared as described in U.S. Pat. No. 4,399,209 and more particularly, for full color imaging, as described in U.S. Pat. No. 4,772,541.

The developer materials used in the present invention are finely divided thermoplastics. Their softening points typically range from about 100° to 200° C., but those skilled in the art will appreciate that materials with higher and lower softening points may also be useful. The particle size is preferably in the range of about 0.5 to 25 microns. A preferred example of a developer material useful in the present invention is a phenolic resin. These resins may be the condensation product of phenols (including substituted phenols) and formaldehyde. Suitably the phenol formaldehyde molar ratio is usually about 1:1 and the degree of condensation ranges from about 2 to 50, but is generally about 4 to 10. The resins may be further modified to include amounts of salicylic acids or substituted salicylic acids in a manner known in the art. Examples of other thermoplastic phenolic resins useful in the present invention are described in U.S. Pat. Nos. 3,455,721; 3,466,184; 3,672,935; 4,025,490; 4,226,962; and 4,647,952.

Representative examples of these phenolic resins are as follows: p-phenylphenol-formaldehyde polymer, p-fluorophenol-formaldehyde polymer, p-chlorophenol-formaldehyde polymer, p-bromophenol-formaldehyde polymer, p-iodophenol-formaldehyde polymer, p-nitrophenol-formaldehyde polymer, p-carboxyphenol-formaldehyde polymer, p-carboalkoxyphenol-formaldehyde polymer, p-aroylphenol-formaldehyde polymer, p-lower alkoxyphenol-formaldehyde polymer, p-alkyl($C_1$-$C_{12}$)-phenol-formaldehyde polymers, in which the p-alkyl($C_1$-$C_{12}$)-phenol is p-methylphenol, p-ethylphenol, p-n-propylphenol, p-isopropylphenol, p-t-butyephenol, p-n-amylphenol, p-isoamylphenol, p-cyclohexylphenol, p-1,1-dimethyl-n-propylphenol, p-n-hexylphenol, p-isohexylphenol, p-1,1-dimethyl-n-butylphenol, p-1,2-dimethyl-n-butylphenol, p-n-heptylphenol, p-isoheptylphenol, p-5,5-dimethyl-n-amylphenol, p-1,1-dimethyl-n-amylphenol, p-n-octylphenol, p-1,1,3,3-tetramethylbutylphenol, p-isooctylphenol, p-n-nonylphenol, p-isononylphenol, p-1,1,3,3-tetramethylamylphenol, p-n-decylphenol, p-isodecylphenol, p-n-undecylphenol, p-isoundecylphenol, p-n-dodecylphenol, etc., and polymers of formaldehyde and isomers of these p-alkyl-phenols where the alkyl groups have 1 to 12 carbon atoms, and copolymers of formaldehyde and mixtures containing two or more of these alkylphenols and the isomers thereof.

More particularly, alkylphenolic resins and, still more particularly, metallated products of alkylphenolic resins are used. The alkyl phenols are monosubstituted by an alkyl group which may contain 1 to 12 carbon atoms. Examples of alkylphenols are ortho- or para- substituted ethylphenol, propylphenol, butylphenol, amylphenol, hexylphenol, heptylphenol, octylphenol, nonylphenol, t-butylphenol, t-octylphenol, etc.

Another class of phenolic resin useful in the present invention is the product of oxidative coupling of substituted or unsubstituted phenols or biphenols. Oxidative coupling may be performed using various catalysts but a particularly desirable catalyst is the enzyme, horseradish peroxidase. A particularly desirable phenolic resin is described in commonly assigned U.S. Pat. No.

4,647,952. A still more particularly useful resin is prepared by oxidative coupling Bisphenol A with hydrogen peroxide in the presence of horseradish peroxidase. This reaction can be carried out in a mixed solvent of water, acetone, and ethylacetate.

The phenolic developers are preferably metallated to improve their developing characteristics. This also contributes to their thermoplastic character as a type of ionomer is formed which dissociates into lower molecular weight species and associates into higher molecular weight species upon cooling. The resins may be metallated by reaction with a salt selected from the group consisting of copper, zinc, aluminum, tin, cobalt and nickel. Most typically, the resins are zincated to improve development. The metal content of the resins generally is about 1 to 5% by weight but may range up to 15%.

In addition to phenolic resins or as an alternative to phenolic resins, certain functionalized acrylic or vinylic resins are useful in the present invention. Examples of these resins are described in U.S. Pat.No. 4,853,364 and 4,877,767. These resins are preferably prepared by an emulsion polymerization process. The process is preferably controlled through monomer and catalyst addition to provide a particle having a core with a lower melt flow temperature and a lower minimum film forming temperature than the shell. For example, the core shell particle may have a nominal melt flow temperature of 80° to 130° C. and the core having a somewhat lower MFT.

Also useful in the present invention are blends of acrylic and phenolic developers as described in U.S. Pat. No. 4,853,364. The reader is directed to the examples of this patent which illustrate compositions which are also useful herein.

The foregoing resins may be used in the form of a film in which case they will be coated on the support for the developer-donor from a solution of the resin. Preferably, however, these resins are used as a finely divided particle. In one case they can be coated from an aqueous emulsion, in other cases known wet and dry milling techniques may be used to prepare particles.

The developer-donor sheet of the present invention is prepared by coating a support with a coating composition of the developer material using conventional coating techniques. The developer material is usually applied to the surface of the support in an amount of about 8 to 15 g/m² depending upon the nature of the developer, whether it is encapsulated and whether it is present in a binder or not.

Photocopy apparatuses useful in practicing the method of the present invention can b constructed by modifying known, commercially available, color copiers such as the Noritsu ® Slide Printer, the Renaissa CC5500 ® from Brother Industries or the Cycolor ® Copier from Seiko-Mead.

Having described the invention in detail and by reference to preferred embodiments thereof, it will be apparent that modifications and variations are possible without departing from the scope of the appended claims.

What is claimed is:

1. A method for forming a transparency containing images having high color density comprising the steps of:

forming an imaging sheet, said imaging sheet comprising a substrate having a layer of microcapsules on the front surface and on the back surface thereof, said microcapsules containing an internal phase which undergoes a physical change upon exposure to actinic radiation, and a color forming agent which is capable of reacting with a developer-containing resin to form a visible image thereon;

simultaneously image-wise exposing said microcapsules on said front and said back surfaces of said imaging sheet to actinic radiation;

assembling said exposed imaging sheet between a pair of developer sheets wherein each of said developer sheets comprises a substrate having a layer of developer-containing resin on one surface thereof, said layer of developer-containing resin on each of said developer sheets contacting the adjacent surface of said imaging sheet;

subjecting said assembly to a uniform rupturing and transfer force wherein said microcapsules are ruptured in an image-wise pattern and said color-forming agent contained in said ruptured capsules is transferred to said developer-containing resin wherein an image-wise reaction between said developer-containing resin and said color-forming agent produces a visible image on each developer sheet, said visible images being mirror images of each other;

separating said developer sheets from said imaging sheet;

assembling said developer sheets such that said visible images are in registration, said visible images being mirror images of each other; and laminating said developer sheets, one to the other, to provide a transparency having high color density.

2. The method of claim 1 wherein said substrate is a transparent polyethylene terephthalate film.

3. The method of claim 2 wherein said developer-containing resin is further characterized in that it exhibits the properties of a hot melt adhesive.

4. The method of claim 3 wherein said developer-containing resin is a phenolic resin.

5. The method of claim 4 wherein said phenolic resin is a product of oxidative coupling of a phenol or biphenol.

6. The method of claim 5 wherein said phenolic resin is a product of oxidative coupling of Bisphenol A.

7. The process of claim 6 wherein said oxidative coupling is performed in the presence of the enzyme, horseradish peroxidase as catalyst.

8. The process of claim 4 wherein said developer-containing resin is a metallated phenolic resin.

9. The method of claim 5 wherein said developer-containing resin is a zincated phenolic resin formed from the reaction of a high alkyl phenol and salicylic acid.

10. The method of claim 3 wherein said developer-containing resin is a mixture of a developer resin and a hot melt adhesive.

11. The method of claim 1 wherein said developer resin is an acrylic or vinylic resin.

12. The method of claim 1 wherein said developer resin is a blend of a phenolic resin and an acrylic or vinylic resin.

13. The method of claim 1 wherein said photosensitive composition includes an ethylenically unsaturated compound.

14. The method of claim 1 wherein said pair of developer sheets comprises a single double-width sheet folded along the midline, said sheet having said developer-containing resin on the inner surface thereof.

15. The method of claim 1 wherein said pair of developer sheets are pre-joined along one edge by adhesive means.

16. The method of claim 1 wherein said developer sheets are laminated to each other at elevated temperature.

17. The method of claim 16 wherein said elevated temperature is from about 75° to about 135° C.

18. The method of claim 2 wherein said actinic radiation is reflected back through said layer of microcapsules.

19. The method of claim 1 wherein said actinic radiation is independently focused on said front and said back surfaces of said imaging sheet to image-wise expose said microcapsules.

* * * * *